United States Patent [19]

Chen

[11] 4,335,350
[45] Jun. 15, 1982

[54] APPARATUS FOR PROBING SEMICONDUCTOR WAFERS

[76] Inventor: James T. C. Chen, 1526 Cherrywood Dr., San Mateo, Calif. 94403

[21] Appl. No.: 152,664

[22] Filed: May 23, 1980

[51] Int. Cl.$^3$ ............................................. G01R 27/14
[52] U.S. Cl. ....................................... 324/64; 324/62; 324/65 P
[58] Field of Search ........................... 324/64, 62, 65 P

[56] References Cited

U.S. PATENT DOCUMENTS

| | | | |
|---|---|---|---|
| 2,142,619 | 1/1939 | Sciaky | 324/64 |
| 3,303,418 | 2/1967 | Rose | 324/64 |
| 3,416,078 | 12/1968 | Boncuk et al. | 324/64 |
| 3,735,253 | 5/1973 | Seger | 324/64 |

OTHER PUBLICATIONS

Gee et al., A Versatile Over-Under Four-Point Probe Apparatus, Zenith Radio Research Corporation Notes on Experimental Technique & Apparatus, J. Phys. E. (GB), vol. 4, No. 1, Jan. 1971, pp. 70-72.

*Primary Examiner*—Stanley T. Krawczewicz
*Attorney, Agent, or Firm*—Stephen P. Fox

[57] ABSTRACT

A two-head probe apparatus measures sheet resistivities of the thin layer on a semiconductor wafer. On one side of the wafer, a first probe head makes contact for injecting current into the wafer and measuring the voltage difference between two surface points. On the other side of the wafer, a second probe head makes contact for monitoring the substrate potential at two probed points on the wafer substrate. The second probe is disposed below a platen supporting the wafer, and the probe electrodes are moved into spring biased contact with the wafer through apertures in the platen by a vacuum actuated piston. Circuitry coupled to the two probe heads computes leakage current and displays sheet resistivity.

12 Claims, 2 Drawing Figures

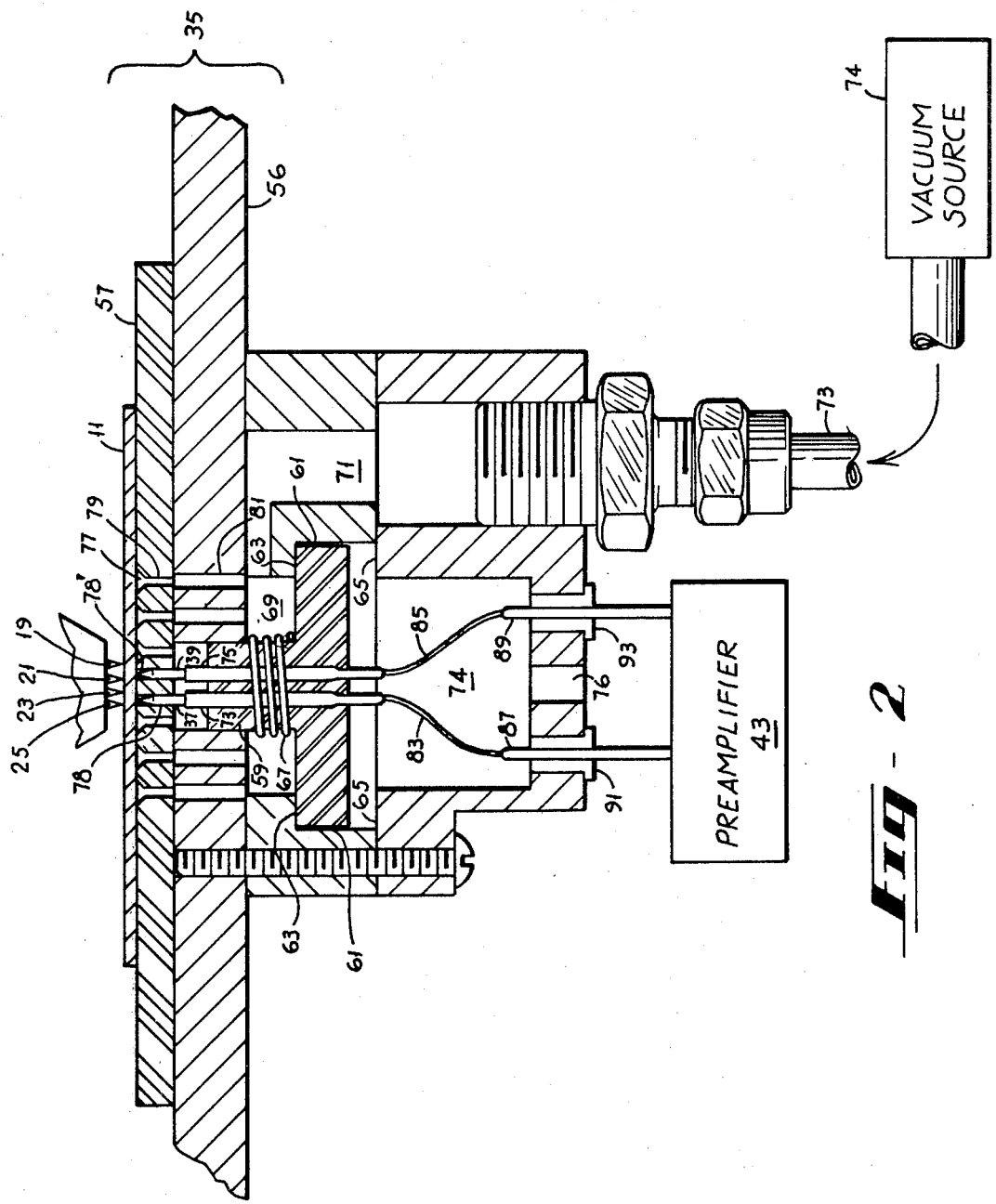

APPARATUS FOR PROBING SEMICONDUCTOR WAFERS

BACKGROUND OF THE INVENTION

This invention relates generally to the measurement of the electrical resistance of a semiconductor sample and an apparatus for probing a semiconductor wafer. One commonly accepted technique for determining sheet resistivity is to use a four-point probe. Typically, four electrodes, or points, are placed in contact with the sample to be measured. A known electrical current is applied between two of the probes and conducted through the sample. The voltage between the other two probes is measured. The values of the current and voltage are used to calculate resistivity of the surface layer of the semiconductor sample according to known formulas.

Four-point probes are effective in measuring sheet resistivity in many cases. However, as the semiconductor industry becomes more technologically advanced, certain limitations of the four-point technique become apparent. Semiconductor devices are now being processed with very thin submicron diffusion or ion implantation layers on semiconductor wafers. Such structures are required for high speed and high frequency integrated circuits and transistors, as well as for higher efficiency solar cells.

One significant problem in using a four-point probe to characterized the layers is that for proper application of the known formula for calculating sheet resistivity, the current injected by the two current probes must be confined to the thin layer on the surface of the semiconductor. In reality, however, some of the injected current may not be confined to the thin surface layer. Instead, it leaks through to the underlying substrate. The leakage current conducted through the substrate cannot be detected by the four-point probe. Hence, the value of current used in the four-point probe formula produces an erroneous result for measured sheet resistivity.

SUMMARY OF THE INVENTION

The present invention permits more accurate measurement of the sheet resistivity of a thin layer disposed on a semiconductor wafer, particularly in the case where the thickness of the thin layer is much less than one micron and/or where the doping density of the thin layer is low. The adverse effect on the measurement due to the existence of leakage current in the wafer substrate in minimized. The invention also permits assessment of the quality of the P-N junction between the thin layer and the substrate.

According to one aspect of the illustrated embodiment of the invention, there is provided a six-point probe. A first probe head having four spaced-apart, linearly aligned, electrodes is positionable in contact with the top surface of a semiconductor layer disposed on a substrate. Circuitry coupled to the first probe head applies a predetermined injected current to the layer through two of the electrodes and detects the voltage difference on the layer between the other two electrodes. A second probe is aligned with the first probe head on the opposite side of the semiconductor wafer. The second probe has two spaced-apart electrodes positionable in contact with the bottom surface of the substrate. Additional circuitry coupled to the two electrodes of the second probe determines the magnitude of the leakage current which flows through the substrate. The leakage is a portion of the injected current which is applied to the top surface of the semiconductor layer by the first probe head. The substrate leakage current is subtracted from the known injected current and the result is used along with the voltage difference detected by the first probe head to determine sheet resistivity.

The two electrodes of the second probe can be placed into direct contact with the semiconductor wafer substrate whenever it is desired to determine leakage current. This is achieved by the provision of a platen for supporting the wafer and a vacuum actuated piston means for moving the two electrodes through apertures in the platen into spring biased contact with the substrate.

BRIEF DESCRIPTION OF THE DRAWINGS

FIG. 2 is an enlarged cross-sectional view of a portion of the six-point probe apparatus of the present invention.

DESCRIPTION OF THE PREFERRED EMBODIMENT

Figure 1:
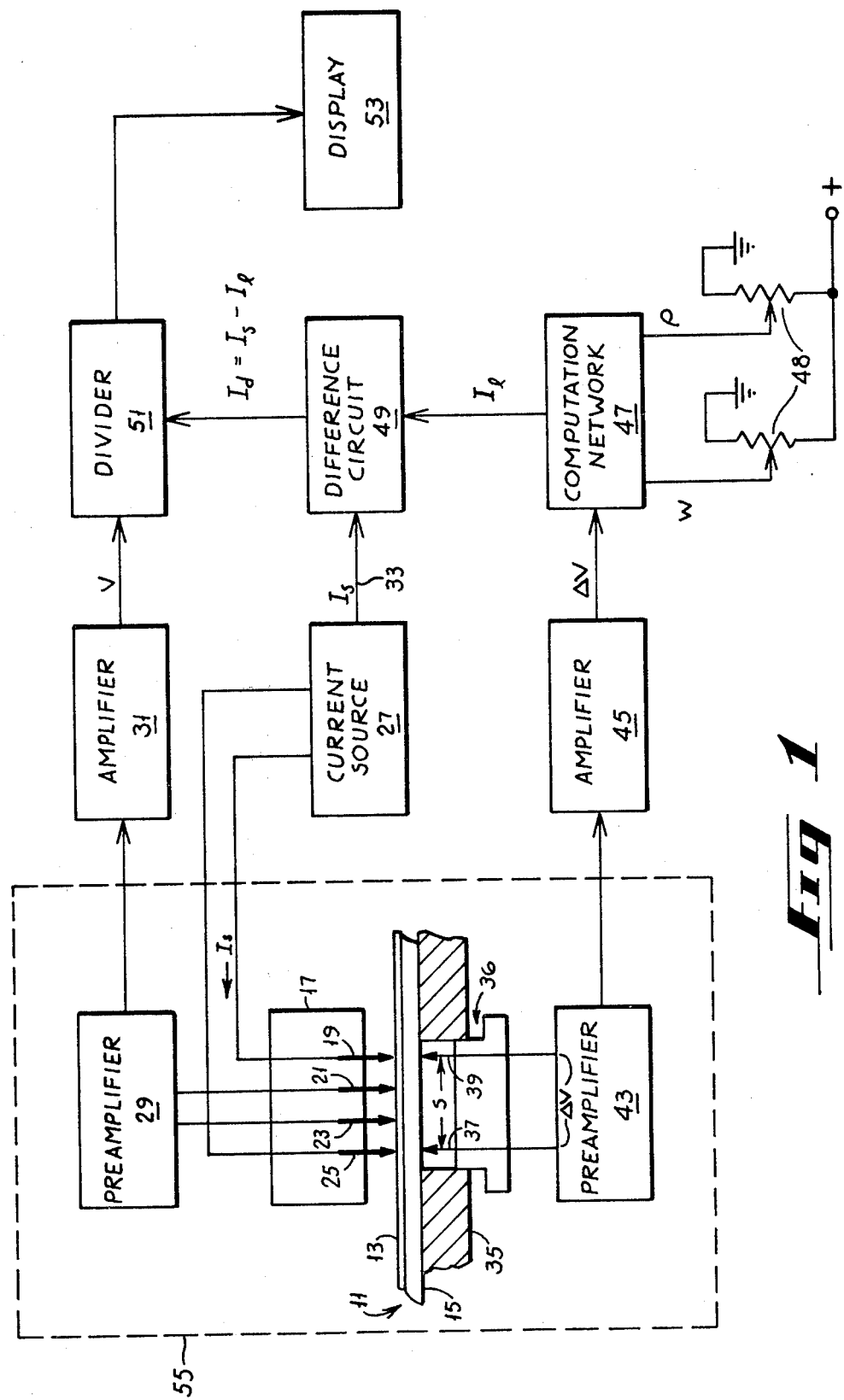
FIG. 1 is a schematic diagram of one embodiment of the present invention.

Referring now to FIG. 1, there is shown a semiconductor wafer 11 including a thin layer 13 disposed on a substrate 15. Layer 13 is usually of submicron thickness and formed on the substrate 15 by diffusion or ion implantation. The wafer 11 may be of the type useful as a solar cell or in the fabrication of high frequency transistors, for example.

Wafer 11 serves as a sample for which the sheet resistivity of the thin film layer 13 is to be measured. There is provided a first probe head 17 which includes four linearly aligned, spaced-apart electrodes 19, 21, 23, and 25. The ends of the four electrodes serve as probe tips and can be positioned in contact with the top surface of layer 13. A current source 27 is connected to the outer electrodes 19 and 25 to inject a known current, $I_S$, into the layer 13. Ideally, the current established between electrodes 19 and 25 flows solely through layer 13; however, in reality some of the current flow between electrodes 19 and 25 passes through the substrate 15, and is deemed to be leakage current.

Leakage current is commonly caused by one or more of three factors: (1) minority carriers can be injected into the substrate by the electrodes 19 and 25, particularly in the case where the semiconductor at the probe electrode contact points is heated, pressed and/or carrying a high density current; (2) the thin layer 13 can easily be penetrated by the current electrodes, and current may be injected directly from the electrodes to the substrate 15; and (3) there may be defects at the junction between layer 13 and substrate 15 in the region near the current electrodes 19 and 25. The manner in which the apparatus of the present invention determines the magnitude of the leakage current is described hereinafter.

The two inner electrodes 21 and 23 of the first probe head 17 sense the voltage difference on the surface of the layer 13 produced in response to the current flow established by electrodes 19 and 25. This voltage difference is amplified by a preamplifier 29. To assure optimum sensitivity, the probe tips 19, 21, 23, and 25 are formed of a high temperature conductive material such as osmium or tungsten carbide. Preamplifier 29 has a high input impedance on the order of $10^{11}$ ohms or more, and a high common mode rejection ratio on the order of 100 dB or more. Preamplifier 29 may be a varactor bridge electrometer for example. The low level output of preamplifier 29 is further amplified by amplifier 31 to produce the output voltage V.

Current source 27 includes internal circuitry for determining the magnitude of the current injected into the semiconductor wafer 11. The magnitude of the current is selected by a switch (not shown) and indicated by a signal level proportional to the current magnitude on the output line 33.

In combination, the current source 27 and preamplifier 29 and amplifier 31 comprise a first circuit means coupled to the first probe head 17.

Wafer 11 is disposed on a platen 35. On the opposite side of wafer 11 from the first probe head 17, there is a second probe 36 including two electrodes 37 and 39. The two electrodes 37 and 39 are movable along an axis perpendicular to the plane of wafer 11 into engagement with the substrate 15 of the wafer. Electrodes 37 and 39 of the second probe 36 are spaced apart with a predetermined spacing S and vertically aligned opposite the outer current electrodes 19 and 25 of the first probe head 17. The two electrodes are preferably formed of osmium, tungsten carbide or stainless steel. Movement of electrodes 37 and 39 is achieved by actuation of a piston 41, as hereinafter described.

The two electrodes 37 and 39 of the second probe head 36 are positionable to engage the bottom surface of the substrate 15 of wafer 11 and sense the voltage difference $\Delta V$ between these two electrodes on the surface of the substrate. This voltage difference is applied to second circuit means including a preamplifier 43, an amplifier 45 and a computation network 47 for determining the magnitude of the leakage current in the substrate 15 which is a portion of the current injected into the wafer by the two electrodes 19 and 25 of the first probe head 17. More particularly, the voltage difference $\Delta V$ across probes 37 and 39 is applied to preamplifier 43 which has a high input impedance on the order of $10^{11}$ ohms and a high common mode rejection ratio of approximately 100 dB or more. The amplified voltage signal from preamplifier 43 is applied to amplifier 45 and then to a computation network 47.

The relationship between the differential voltage $\Delta V$ and the leakage current in the substrate 15 of wafer 11 has been derived as follows:

$$\Delta V = (I_1 \rho / \pi W)[\ln S + C - \ln W] \qquad \text{(Eq. 1)}$$

where, $\Delta V$ is the voltage measured between probes 37 and 39, S is the spacing between these two probes, $\rho$ and W are the resistivity and the thickness of substrate 15, respectively, C is Euler's constant (i.e., 0.577215665), and $I_1$ is the leakage current through the substrate 15.

Equation 1 can be solved for the leakage current, $I_1$, and simplified as follows:

$$I_1 = \frac{\Delta V \pi W}{\rho \left[\ln \frac{S}{W} + C\right]} \qquad \text{(Eq. 2)}$$

Network 47 includes conventional analog or digital computation circuitry for performing the computation of equation 2 to produce an output voltage indicative of the leakage current $I_1$. The value of the differential voltage $\Delta V$ is received from amplifier 45, and the values for the substrate resistivity $\rho$ and thickness W are set as input voltage levels by potentiometers 48 in accordance with the particular characteristics of the substrate 15. The other values of the parameters in equation 2 are preset in network 47.

The output voltage from computation network 47 is applied to one input of a third circuit means including a difference circuit 49. The other input to difference circuit 49 is received on signal line 33 and represents the magnitude of the current $I_s$ injected into layer 13 of wafer 11 by the electrodes 19 and 25 from current source 27. The output of circuit 49 is a voltage signal $I_d$ representing the magnitude of the difference in current between the injected current $I_s$ and the leakage current $I_1$. The current $I_d$ determined by circuit 49 represents the portion of the injected current which is confined to layer 13 of wafer 11. This is because the current which leaks through layer 13 into substrate 15 has been determined and subtracted from the injected source current $I_s$.

A fourth circuit means includes a divider 51 having two inputs. One input is the voltage signal V from amplifier 31 which represents the voltage difference between electrodes 21 and 23 of the first probe head 17. The other input is the voltage signal representing the magnitude of the current $I_d$ confined to layer 13. Divider circuit 51 calculates the sheet resistivity of layer 13, $\rho_s$, from the inputs V and $I_d$ according to the following equation:

$$\rho_s = (\pi / \ln 2) \cdot (V / I_d) \qquad \text{(Eq. 3)}$$

Equation 3 is basically the same as the well known equation for determining thin layer sheet resistivity by a four-point probe, except that the current signal has been compensated to account for the leakage current $I_1$ through the substrate 15 of wafer 11. The output $\rho_s$ from divider 51 is applied to a display circuit 53 which produces a digital or analog representation of sheet resistivity.

To assure the accuracy of the resistivity measurement, there is provided an optically opaque conductive, aluminum screen 55 which encloses the assemblage of the first and second probes 17 and 41, the respective preamplifiers 29 and 43, and the wafer 11 which serves as the sample. Screen 55 precludes light and stray electromagnetic fields from adversely affecting the measurement process.

FIG. 2 illustrates the second probe 36 in greater detail. The platen 35 includes a perforated support plate 56 upon which is disposed a perforated teflon pad 57. The pad 57 in turn supports the sample wafer 11. The first probe head 17 is positioned over wafer 11 and the probe electrodes 19, 21, 23, and 25 are positioned in contact with the wafer 11.

Support plate 56 has an aperture therein receiving a piston 59 which may travel on an axis perpendicular to the plane of the wafer 11. The upper portion of piston 59 forms a vacuum chamber 69 along with sidewalls 61, and the bottom surface of support plate 56. Vertical movement of the piston 59 is limited upwardly by surfaces 63 of the chamber; whereas, downward movement of the piston is limited by the surfaces 65. When the vacuum chamber 69 is filled with air, the piston 59 is biased away from wafer 11 against the limit surfaces 65 by a coil spring 67. The vacuum chamber 69 communicates through a vacuum port 71 and inlet pipe 73 to a vacuum source 74. When chamber 69 is evacuated of air, piston 59 travels upwardly against the bias of spring 67 by action of the pressure of atmospheric air on the bottom of piston 59. Air enters the chamber portion 74 through a port 76.

Disposed internally of piston 59 and along the vertical axis of movement thereof are two tubes 73 and 75. The tubes are spaced apart and have ends which terminate a predetermined distance below the teflon pad 57 when piston 59 is positioned in its upward most position, as shown. Contained within the two tubes 73 and 75, and extending therefrom, are the two electrodes 37 and 39 which comprise the second probe. Each of the two electrodes 37 and 39 are resiliently biased upward toward the bottom portion of the wafer 11 so that the substrate of the wafer is firmly contacted by the electrodes when piston 59 is moved into its upward position by operation of the vacuum source. The resilient biasing of the two electrodes 37 and 39 is achieved by a spring (not shown) contained within each of the tubes 73 and 75. The electrodes 37 and 39 extend upwardly through apertures or perforations 78 and 78' in the teflon pad 57.

Teflon pad 57 also includes a plurality of grooves 77 inscribed on the surface thereof. These grooves 77 may be in the form of concentric circles, for example. Each groove has the lower portion thereof communicating with a plurality of apertures 79 in the pad 57. These apertures in turn communicate through ports 81 in the support plate 56. Ports 81 communicate with vacuum chamber 69. In operation, vacuum applied to the chamber 69 by vacuum source 74 is also applied to each of the ports 81 and thence through the apertures 79 in the teflon pad to the grooves 77, thereby to firmly hold the wafer onto pad 57 during the testing and measuring process.

Electrodes 37 and 39 are respectively electrically coupled by wires 83 and 85 through respective support posts 87 and 89 to the preamplifier 43. Support posts 87 and 89 are held respectively by teflon insulators 91 and 93. The voltage difference on the substrate 15 sensed by the two electrodes 37 and 39 is applied to the preamplifier 43 and then processed by the circuitry of FIG. 1 described above.

I claim:

1. Apparatus for determining sheet resistivity of a semiconductor sample having a layer disposed on a substrate comprising:
   a first probe disposed on one side of said sample and having four spaced-apart electrodes positionable in contact with the surface of said layer;
   first circuit means coupled to said probe for applying a determinable injected current to said layer through a selected two of said electrodes and for indicating the voltage difference on said layer between the other two of said electrodes;
   a second probe disposed in alignment with said first probe and on the opposite side of the sample, said second probe having two spaced-apart electrodes positionable in contact with the surface of said substrate; and
   second circuit means coupled to the electrodes of said second probe for determining the magnitude of leakage current flowing through the substrate which is a portion of said injected current applied to said layer.

2. The apparatus of claim 1, further including third circuit means coupled to said first and second circuit means and responsive to the magnitude of said injected current and said leakage current for determining the portion of said injected current flowing through said layer.

3. The apparatus of claim 2, further including fourth circuit means coupled to said first and third circuit means and responsive to said voltage difference on said semiconductor layer and to said portion of the injected current flowing through the layer for determining the sheet resistivity of the layer.

4. The apparatus of claim 1, wherein said second circuit means includes:
   means for detecting the voltage difference, $\Delta V$, between the two electrodes of said second probe;
   means for providing signals indicative of the substrate resistivity, $\rho$, and the substrate thickness, $W$; and
   computation network means responsive to said detecting means and said signal providing means for computing said leakage current from $\Delta V$, $\rho$, $W$, and the spacing, $S$, between the two electrodes of said second probe.

5. The apparatus of claim 4, wherein said computation network means computes said leakage current according to the formula:

$$I_1 = \frac{\Delta V \pi W}{\rho \left( \ln \frac{S}{W} + C \right)}$$

where $C$ is a constant.

6. The apparatus of claim 1, wherein said second probe includes:
   a platen having a top surface for supporting said substrate, said platen having apertures therein for receiving said two spaced-apart electrodes, respectively; and
   means disposed below said platen for moving said two electrodes through said apertures and into contact with the bottom surface of the substrate supported by said platen.

7. The apparatus of claim 6, wherein said means for selectively moving said two electrodes includes:
   a chamber containing a piston movable along an axis perpendicular to the plane of said platen;
   two tubes disposed in said piston in spaced-apart relation parallel to the axis of movement of said piston, each of said tubes having an end terminating adjacent to said platen; and
   said two electrodes being disposed in said two tubes, respectively, each of said two electrodes having a contact tip resiliently biased toward the substrate disposed on said platen, thereby to engage said substrate upon movement of said piston toward said substrate.

8. The apparatus of claim 7, wherein said chamber is a vacuum chamber and said piston is resiliently biased away from said platen, and further including means providing a vacuum to said chamber for moving said piston against bias toward said platen, thereby to move said two electrodes into engagement with said substrate.

9. The apparatus of claim 8, wherein said platen is configured to define a plurality of grooves disposed in the top surface thereof in proximity to said two spaced-apart electrode apertures, said grooves communicating through apertures in said platen to said vacuum providing means, thereby to hold said substrate firmly on said platen while the second probe is in contact with the substrate.

10. Apparatus for positioning measuring electrodes in contact with a semiconductor sample comprising:
- a perforated planar platen having a top surface for supporting the sample;
- a chamber disposed below said platen;
- a piston contained within said chamber and movable along an axis perpendicular to the plane of said platen;
- two tubes disposed in said piston in spaced-apart relation parallel to the axis of movement of said piston, each of said tubes having an end terminating adjacent to said platen; and
- two electrodes disposed in said two tubes, respectively, each of said two electrodes having an electrically conductive tip resiliently biased to extend from the corresponding tube, said electrodes being movable through perforations in said platen into engagement with the semiconductor sample in response to movement of said piston.

11. The apparatus of claim 10, wherein said chamber is a vacuum chamber and said piston is resiliently biased away from said platen, and further including means providing a vacuum to said chamber for moving said piston against bias toward said platen, thereby to move said two electrodes into engagement with said sample.

12. The apparatus of claim 11, wherein said platen is configured to define a plurality of grooves disposed on the top surface thereof in proximity to said two electrodes, said grooves communicating through perforations in said platen to said vacuum providing means, thereby to hold said sample firmly on said platen while said two electrodes are in contact with the semiconductor sample.

* * * * *